US006181606B1

(12) United States Patent
Choi et al.

(10) Patent No.: US 6,181,606 B1
(45) Date of Patent: Jan. 30, 2001

(54) NONVOLATILE INTEGRATED CIRCUIT MEMORY DEVICES HAVING IMPROVED WORD LINE DRIVING CAPABILITY AND METHODS OF OPERATING SAME

(75) Inventors: Ki-Hwan Choi, Seoul; Jong-Min Park, Suwon, both of (KR)

(73) Assignee: Samsung Electronics Co., Inc. (KR)

( * ) Notice: Under 35 U.S.C. 154(b), the term of this patent shall be extended for 0 days.

(21) Appl. No.: 09/428,816

(22) Filed: Oct. 28, 1999

(30) Foreign Application Priority Data

Oct. 30, 1998 (KR) .................................................. 98-46481

(51) Int. Cl.⁷ ..................................................... G11C 16/06
(52) U.S. Cl. ................................ 365/185.23; 365/185.28; 365/185.29
(58) Field of Search ......................... 365/185.23, 185.28, 365/185.29, 185.3, 185.01, 185.18

(56) References Cited

U.S. PATENT DOCUMENTS

| | | | |
|---|---|---|---|
| 5,237,535 | 8/1993 | Mielke et al. | 365/218 |
| 5,406,521 | * 4/1995 | Hara | 365/218 |
| 5,677,873 | 10/1997 | Choi et al. | 365/185.17 |
| 5,696,717 | 12/1997 | Koh | 365/185.22 |
| 5,729,491 | 3/1998 | Kim et al. | 365/185.17 |
| 5,734,609 | 3/1998 | Choi et al. | 365/185.17 |
| 5,748,529 | 5/1998 | Lee | 365/185.17 |
| 5,768,191 | 6/1998 | Choi et al. | 365/185.22 |
| 5,768,215 | 6/1998 | Kwon et al. | 365/238.5 |
| 5,796,293 | 8/1998 | Yoon et al. | 327/536 |
| 5,831,905 | * 11/1998 | Hirano | 365/185.29 |
| 5,856,688 | 1/1999 | Lee et al. | 257/295 |
| 5,862,074 | 1/1999 | Park | 365/185.03 |

* cited by examiner

Primary Examiner—David Nelms
Assistant Examiner—Hoai V. Ho
(74) Attorney, Agent, or Firm—Myers Bigel Sibley & Sajovec

(57) ABSTRACT

Nonvolatile integrated circuit memory devices include a memory cell array having a plurality of rows of memory cells therein that are electrically coupled to respective word lines. A word line driver circuit is provided having a plurality of outputs electrically coupled to the word lines. A preferred voltage supply control circuit is also provided. This voltage supply control circuit is responsive to a verify enable signal and a flag signal and powers the word line driver circuit at a first voltage level when the verify enable signal is inactive or the flag signal is active, and powers the word line driver circuit at a second voltage level greater than the first voltage level when the verify enable signal is active and the flag signal is inactive. The first voltage level corresponds to a power supply voltage level Vcc and the second voltage level corresponds to a boosted voltage level Vpp having a magnitude that exceeds a magnitude of the power supply voltage level Vcc. The memory device also comprises a program/erase verification control circuit that generates an active verify enable signal continuously during a verification time interval and generates an active flag signal as a series of pulses during the verification time interval. Because the generation of an active flag signal results in the generation of a word line voltage having reduced magnitude, smaller pull-down transistors can be used within the word line driver circuit and higher integration densities can therefore be achieved.

16 Claims, 6 Drawing Sheets

NONVOLATILE INTEGRATED CIRCUIT MEMORY DEVICES HAVING IMPROVED WORD LINE DRIVING CAPABILITY AND METHODS OF OPERATING SAME

RELATED APPLICATION

This application is related to Korean Application No. 98-46481, filed Oct. 30, 1998, the disclosure of which is hereby incorporated herein by reference.

FIELD OF THE INVENTION

The present invention relates to integrated circuit devices, and more particularly to integrated circuit memory devices and methods of operating integrated circuit memory devices.

BACKGROUND OF THE INVENTION

A flash EEPROM cell transistor typically has a floating gate which is completely surrounded by insulation and generally disposed between its source and drain region formed in a silicon substrate and a control gate coupled to a word line. In this cell, charge carriers (i.e., electrons) can be injected through the insulation to the floating gate when the cell is programmed. Operation of a flash EEPROM device is typically divided into three modes including programming, erasing and reading.

A flash cell is typically programmed by hot electron injection from the substrate to the floating gate. To induce such an effect, it is necessary to supply the control gate and drain of the cell with program volages (e.g., about 8–12 V for the control gate and 5–6 V for the drain) which are higher than read voltages (e.g., 4–5 V for the control gate, about 1 V for the drain, and 0 V for the source and bulk) for reading data out of the cell while grounding its source and bulk.

During the programming mode, the floating gate accumulates the hot electrons and traps the accumulated electrons. The accumulation of a large quantity of trapped electrons on the floating gate causes the effective threshold voltage of the cell transistor to increase (e.g., about 6–7 V). If this increase is sufficiently large, the cell transistor will remain in a non-conductive state when read voltages are applied thereto during a read operation. In this programmed state, the cell may be said to be storing a logic 0 ("OFF cell"). Such a programmed state of the cell remains even when power supply is interrupted.

Erasing a flash cell transistor includes removing charge accumulated on its floating gate. The erasing of a flash cell can be carried out, for example, by applying a negative high voltage (e.g., about −10 V) to its control gate and an appropriate positive voltage (e.g., 5–6 V) to its bulk while floating its source and drain. This causes cold electron tunneling (i.e., Fowler-Nordheim tunneling) through the thin insulation between the floating gate and the bulk, leading to a decrease in the threshold voltage of the cell transistor (e.g., 1–3 V). The erase voltages may be applied to the cell until it is erased below a maximum acceptable threshold voltage. Accordingly, if a flash cell has been erased, it will heavily conduct. In this case, the cell may be said to be storing a logic 1 ("ON cell"). Thus, by monitoring the bit line current, the programmed or erased state (i.e., 1 or 0) of the cell can be determined.

Meanwhile, most of the state-of-the-art flash memory devices of high density adopt a segmented cell array architecture in order to reduce the chip size. In a segmented array architecture, the bulk and the cells are divided into a number of sectors and the sources of the cells within a sector are commonly coupled to the corresponding bulk sector. This architecture causes all cells within a sector (of, e.g., 16 k or 64 k bytes capacity) to be erased simultaneously.

In such a sector erase operation, due to nonuniformity in the programmed threshold voltage, manufacturing condition, amount of use, temperature, etc., one or more cells within the sector may be erased below a minimum acceptable threshold voltage. This is because too much charge is removed from the floating gates of the cells, making the cells "depletion-like". The cell erased below the minimum threshold is commonly referred to as being "overerased". An overerased cell may induce a leakage current on its associated bit-line, thereby causing errors when reading other cells on the same bit-line. One solution to this problem is to repair the overerased cells. The method of repairing the overerased cells is an iterative process utilizing overerase verification and low-voltage level programming.

In general, the sector erase operation of flash EEPROM device is carried out as in the following. First, all of the cells within a sector are sequentially programmed to narrow their threshold distribution (referred to as "first programming"). All the cells of the sector are then erased simultaneously (referred to as "main erasing"). Thereafter, a repair operation begins by selecting a row of word-line and examining the cells on the selected row one by one along columns of bit-lines to determine whether any of the cells are overerased. This procedure is commonly referred to as overerase verification. In performing verification, a cell is identified as overerased when it conducts current in excess of the current expected at the lowest threshold voltage. Once identified as overerased, a cell is programmed using low-level repair voltages (e.g., 2–5 V to the control gate, 6–9 V to the drain, and 0 V to the source and bulk) (referred to as "second programming"). Repair of the remaining cells on other rows is performed in a similar fashion.

In such programming operations, the programmed threshold voltage of a flash cell is checked by a program verify algorithm. The program verification typically involves a series of interleaved program and read operations. In this verification operation, the amount of charge stored in the floating gate of the cell is monitored by supplying the selected word line with a program verify voltage (e.g., about 6 V), to determine if the cell has a desired threshold voltage. When the cell is programmed to the target threshold voltage (i.e., "program pass"), further programming of the cell is inhibited and programming of the next cell begins. If, however, the cell is identified as "program fail", the cell is reprogrammed within the limit of a given maximum number of reprogramming operations.

In the above-described second programming operations, when a cell is identified as program fail, the main erasing and the second programming for the cell is performed again. An example of a contemporary technique for correcting overerased cells is described in U.S. Pat. No. 5,237,535 to Mielke et al., entitled "Method of Repairing Overerased Cells in a Flash Memory".

FIG. 1 illustrates a conventional flash EEPROM device. The flash memory device includes a non-volatile EEPROM cell array 10, a row decoder 12, a word-line driving circuit 14, a column decoder 16, a column selector 18, a voltage boosting circuit 20, a voltage switching circuit 22, and a program/erase control circuit 24.

The voltage boosting circuit 20 generates the boosted voltage Vpp (e.g., 6–7 V) by using the power supply voltage (e.g., 2.7–3.6 V). The program/erase control circuit 24 generates a verify enable signal VER_EN which is activated for program verification and overerase verification in program and erase verify modes of the memory device. The voltage switching circuit 22 delivers either of the power supply voltage Vcc and the boosted voltage Vpp to the word-line driving circuit 14 in response to the verify enable signal VER_EN. As shown in FIG. 1, the word-line driving circuit 14, placed between the row decoder 12 and the memory cell array 10, consists of a plurality of word-line drivers WD1–WDm which correspond to the word-lines WL1–WLm, respectively.

Referring to FIG. 2, there is shown a detailed circuit configuration of the respective conventional word-line drivers WD1–WDm. As shown in the figure, each word-line driver WDi (i=1, 2, . . . , or m) includes a level shifter consisting of two P-channel MOS (PMOS) transistors 30 and 32, two N-channel MOS (NMOS) transistors 34 and 36, and an inverter 38. The word-line driver (or level shifter) WDi is coupled to a corresponding word line WLi which is commonly coupled to the control gates of the memory cell transistors Ci1–Cin in the memory cell array 10. The word-line driver WDi is provided for supplying a higher voltage signal than a common MOS voltage signal.

The voltage switching circuit 22 supplies the word-line driver WDi with the power supply voltage Vcc in the data read mode, and with the boosted voltage Vpp in the program and erase modes. When the word-line driver WDi (i=1, 2, . . . , or m) corresponding a row of the word line WLi is selected by the row decoder 12 including a NAND gate 28 which decodes row address signals X_Add, the word-line driver WDi sets the potential of the word line WLi to Vcc in the data read mode, and to Vpp in the program or erase mode. Thus, the control gates of the memory cell transistors Ci1–Cin (i=1, 2, . . . , or m) on the row are supplied with the power supply voltage Vcc in the data read mode and with the boosted voltage in the program and erase modes.

A timing diagram for the program and erase modes of the conventional non-volatile memory device is shown in FIG. 3. When, in program/erase mode, the verify enable signal VER_EN is inactivated and none of word-line drivers WD1–WDm are selected, a node 40 of the respective word-line drivers WD1–WDm is driven to a logic high level ('1'). In each word-line driver WDi (i=1, 2, . . . , or m), the inverter 38 drives a node 42 to a logic low level ('0'). The NMOS transistor 36 is conductive while the NMOS transistor 34 is non-conductive, so that each word-line WLi (or node 46) is discharged to maintain a reference voltage of 0 V (i.e., ground voltage), making the PMOS transistor 30 conductive. A node 44 is thus charged to the power supply voltage Vcc.

When the signal VER_EN is activated, a program or erase verify operation starts by selecting the first row of word-line WL1. By the row decoder 12 responsive to a row address X_Add, when a word-line driver WD1 is selected, the node 40 within the word-line driver WD1 is driven to the logic low level by the NAND gate 28 within the row decoder 12. The inverter 38 thus drives the node 42 to the logic high level, so the NMOS transistor 34 becomes conductive while the NMOS transistor 36 becomes non-conductive. Therefore, the node 44 is discharged to the ground voltage so that the PMOS transistor 32 is turned on. As a result, the word-line WL1 is driven up to the boosted voltage level Vpp.

Thereafter, a first group of cell transistors C11, C12, . . . , and C1n on the row of word-line WL1 are selected in turn by the column addresses Y_Add while the control gates of the cell transistors C11, C12, . . . , and C1n are supplied with the boosted voltage Vpp via the word-line WL1. During time intervals t1 and t2, the first and second cell transistors C11 and C12 are program/erase verified. In time interval t3, the program/erase verification of the last cell transistor C1n on the row is performed.

The row address X_Add is updated to select the next row of word-line WL2 after the verification of the last cell transistor C1n has been completed. At this time, the word-line WL2 is boosted up to Vpp while the word-line WL1 is discharged to 0 V. Thereafter, a second group of cell transistors C21, C22, . . . , and C2n on the row of word-line WL2 are selected one by one depending on the column addresses Y_Add. Verification of the remaining cells on other rows is carried out in the same manner.

When such a conventional non-volatile memory device is integrated on a single chip, the word-line pitch PL (i.e., distance between adjacent word lines) is determined depending on the size of each memory cell transistor, the size of each NAND gate in the row decoder 12, and the size of each of the elements constituting the word-line drivers WD1–WDm. In general, the size of each element used in the word-line driver (i.e., level shifter) is greater than that of each of the NAND gates within the row decoder 12 and that of each of memory cell transistors since the word-line driver has to drive a high voltage Vpp. Thus, as illustrated by FIG. 1, the word-line pitch PL is determined by the size of each element constituting the word-line drivers WD1–WDm.

In the conventional word-line driver of FIG. 2, the size of the NMOS transistor 34 may be about five times as large as that of the PMOS transistor 30 in order to provide fast and smooth switching of the high voltage Vpp. The ratio increases with decreasing power supply voltage. Accordingly, since a large number of word lines and word-line drivers are provided in a non-volatile memory device, the level of integration of the non-volatile memory device is limited by the size of the word-line drivers and transistors therein.

SUMMARY OF THE INVENTION

It is therefore an object of the present invention to provide improved integrated circuit memory devices and improved methods of operating integrated circuit memory devices.

It is another object of the present invention to provide highly integrated memory devices.

These and other objects, advantages and features of the present invention may be provided by nonvolatile integrated circuit memory devices that include a memory cell array having a plurality of rows of memory cells therein that are electrically coupled to respective word lines. A word line driver circuit is provided having a plurality of outputs electrically coupled to the word lines. A preferred voltage supply control circuit is also provided. This voltage supply control circuit is responsive to a verify enable signal and a flag signal and powers the word line driver circuit at a first voltage level when the verify enable signal is inactive or the flag signal is active, and powers the word line driver circuit at a second voltage level greater than the first voltage level when the verify enable signal is active and the flag signal is inactive. The first voltage level corresponds to a power supply voltage level Vcc and the second voltage level corresponds to a boosted voltage level Vpp having a magnitude that exceeds a magnitude of the power supply voltage level Vcc. The memory device also comprises a program/erase verification control circuit that generates an active verify enable signal continuously during a verification time interval and generates an active flag signal as a series of pulses during the verification time interval. Because the generation of an active flag signal results in the generation of a word line voltage having reduced magnitude, smaller pull-down transistors can be used within the word line driver circuit and higher integration densities can therefore be achieved.

According to another embodiment of the present invention, a preferred method of operating an integrated circuit memory device comprises the steps of verifying a state of a first row of memory cells while simultaneously driving a first word line electrically coupled to the first row of memory cells at a boosted voltage level, during a first verification time interval. Then, in anticipation of a change in the row address, a "level-shifting" step is performed to drive the word line at a reduced voltage level that is intermediate the boosted voltage level and a reference voltage level (e.g., Vss). After this "level-shifting" step, operations are then performed to verify a state of a second row of memory cells while simultaneously driving the first word line at the reference voltage level and a second word line electrically coupled to the second row of memory cells at the boosted voltage level, during a second verification time interval.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
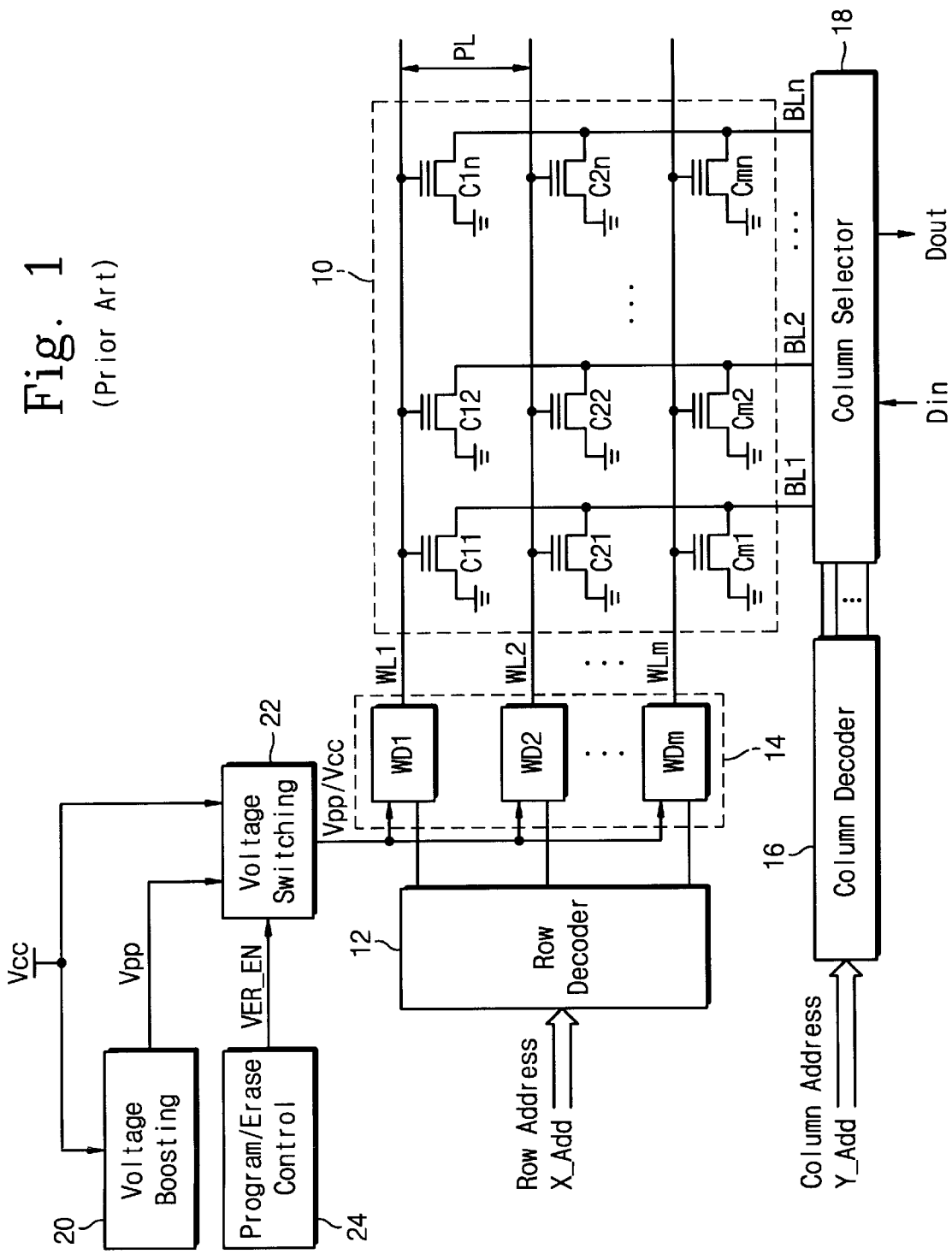
FIG. 1 is a block diagram of a conventional nonvolatile integrated circuit memory device.
Figure 2:
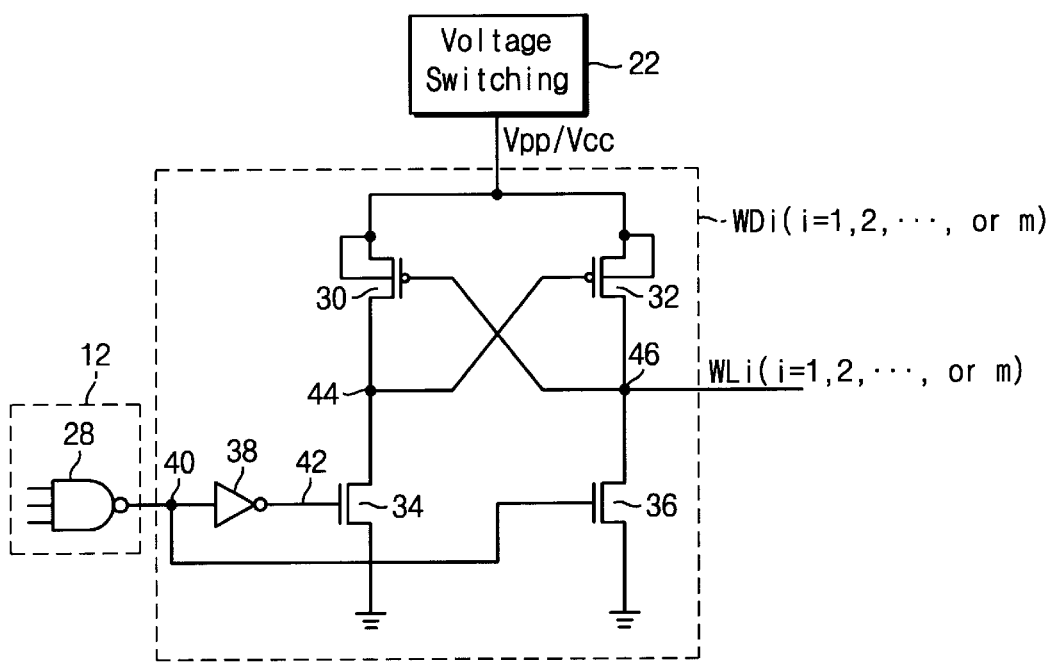
FIG. 2 is an electrical schematic of a conventional word line driver circuit of FIG. 1.
Figure 3:
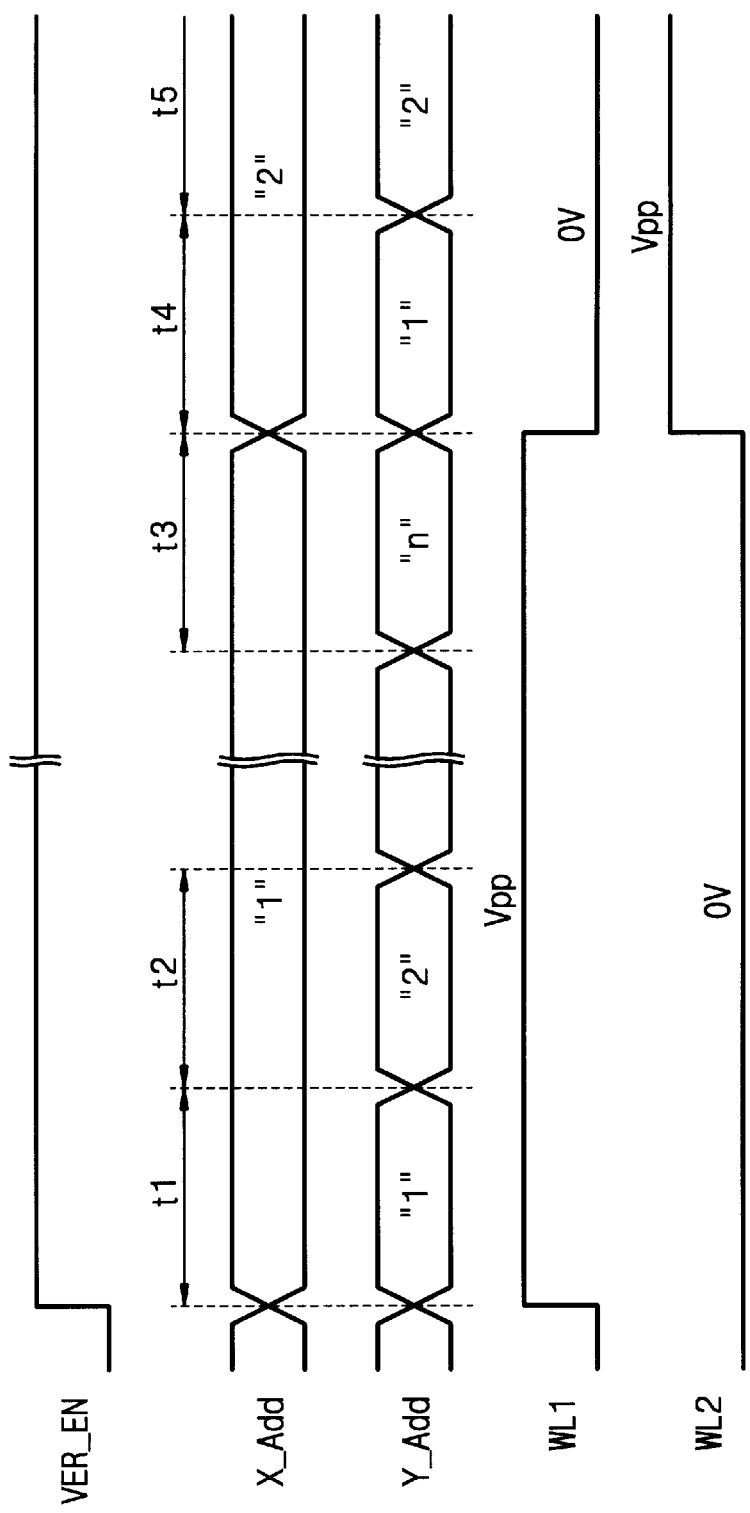
FIG. 3 is a timing diagram that illustrates operation of the memory device of FIG 1.
Figure 4:
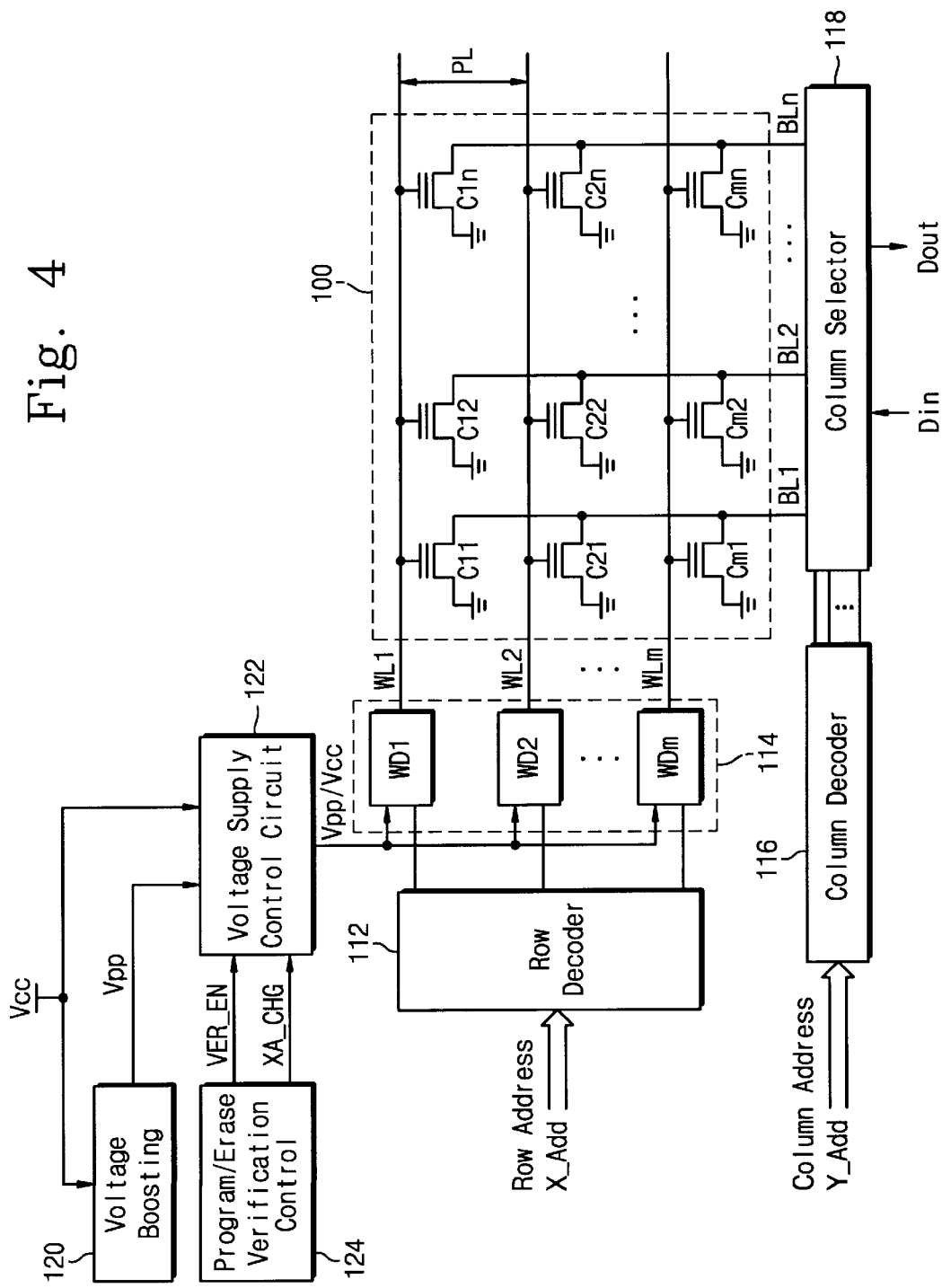
FIG. 4 is a block diagram of an integrated circuit memory device according to an embodiment of the present invention.

Referring now to FIG. 4, an integrated circuit memory device according to an embodiment of the present invention will be described. In particular, the memory device comprises a nonvolatile memory cell array 100 that may have a plurality of EEPROM memory cells C11–Cmn therein. As will be understood by those skilled in the art, the memory cells may be arranged as a two dimensional array of cells having a plurality of rows of memory cells and a plurality of columns of memory cells therein. As illustrated, "m" rows and "n" columns of memory cells may be provided as an "mxn" array of cells. Each row of memory cells may be electrically coupled to a respective word line (WL1–WLm) and each column of memory cells may be electrically coupled to a respective bit line (BL1–BLn). A column selection circuit 118 may be provided so that data (Dout) can be read from the memory cells and data (Din) can be written into the memory cells. The column selection circuit 118 receives column selection signals from a column decoder 116. The column decoder 116 generates the column selection signals in response to a column address Y_Add.

The word lines WL1–WLm are also driven by a word line driver circuit 114 that contains a plurality of word line drivers (WD1–WDm) therein that operate as level-shifters. As illustrated, the word line driver circuit 114 is powered by a voltage supply control circuit 122 and receives row select signals from a row decoder 112. The voltage supply control circuit 122 may also be referred to as a voltage switching circuit. As will be understood by those skilled in the art, the row decoder 112 generates respective row select signals in response to a row address X_Add. The voltage supply control circuit 122 receives a boosted voltage Vpp and a power supply voltage Vcc. Here, the boosted voltage Vpp may have a magnitude of 6–7 volts and the power supply voltage Vcc may have a magnitude of about 1.7–3.6 volts. The boosted voltage Vpp may be generated by a conventional voltage boosting circuit 120 that receives the power supply signal Vcc. Exemplary voltage boosting circuits are more fully described in U.S. Pat. No. 5,796,293 to Yoon et al., entitled "Voltage Boosting Circuits Having Backup Voltage Boosting Capability", assigned to the present assignee, the disclosure of which is hereby incorporated herein by reference. As described more fully hereinbelow with respect to FIG. 5, the voltage supply control circuit 122 is also responsive to a verify enable signal VER_EN and a flag signal XA_CHG. These signals are generated by a program/erase verification control circuit 124. The timing of the generation of the verify enable signal VER_EN and the flag signal XA_CHG is more fully illustrated by FIG. 6.

Figure 5:
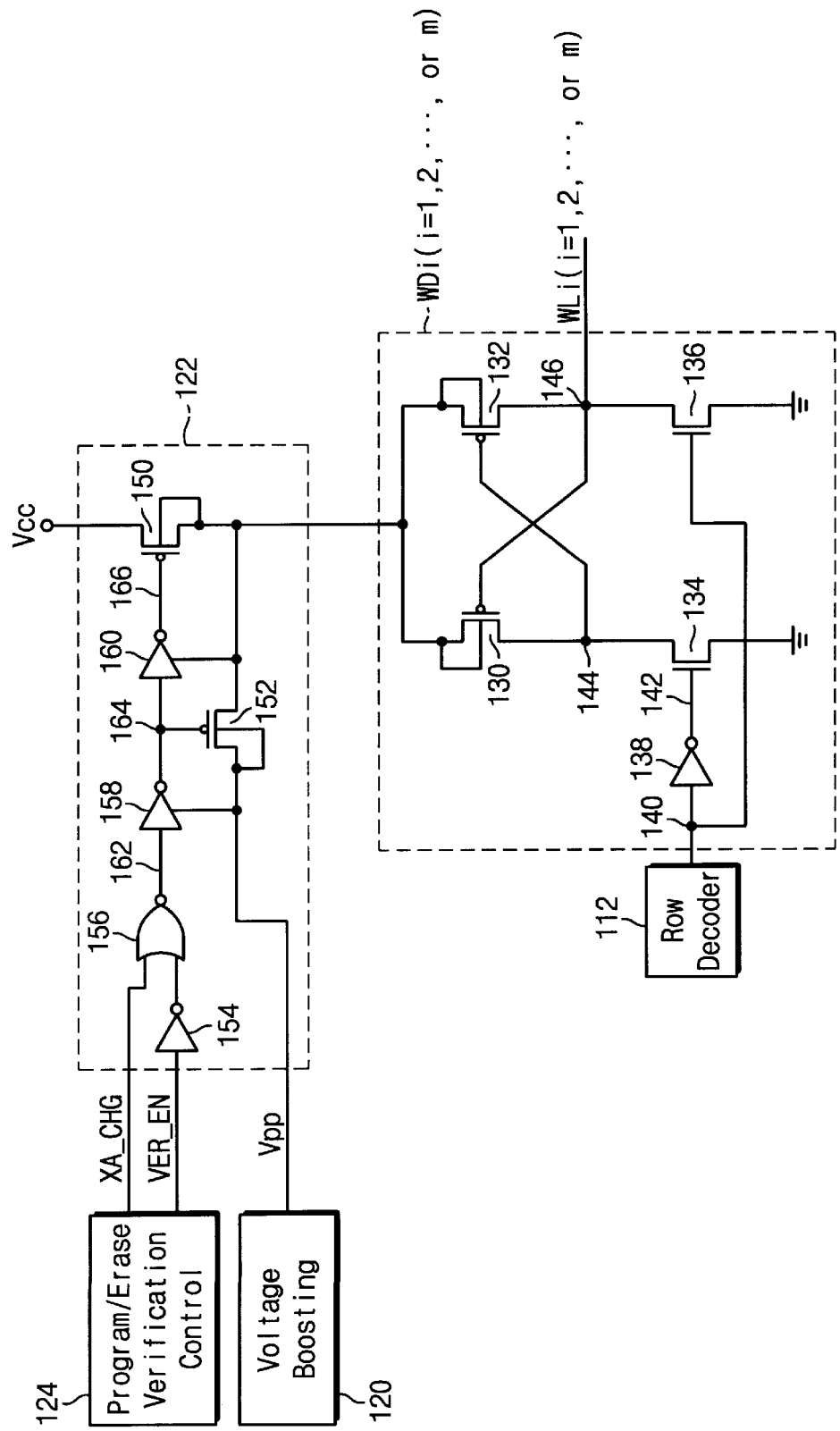
FIG. 5 is an electrical schematic of a voltage supply control circuit, voltage boosting circuit, program/erase verification control circuit, row decoder and word line driver circuit according to the embodiment of FIG. 4.

Referring now to FIG. 5, operation of the word line driver circuit 114 and preferred voltage supply control circuit 122 of FIG. 4 will be described. In particular, the word line driver circuit 114 includes a plurality of word line drivers WD1–WDm and each word line driver receives a respective row select signal from the row decoder 112. For example, during a program or erase operation on the first row of memory cells, the first word line driver receives a logic "0" row select signal at an input node 140. This logic "0" row select signal causes the NMOS pull-down transistor 136 to turn off and causes the NMOS pull-down transistor 134 to turn on when node 142 is driven to a logic "1" level by the inverter 138. When NMOS pull-down transistor 134 turns on, node 144 is pulled from a logic 1 level to a logic "0" level (e.g., Vss, GND=0 volts) and PMOS pull-up transistor 132 turns on. When PMOS pull-up transistor 132 turns on, the output node 146 of the word line driver is pulled up to a logic 1 level. The magnitude of this logic 1 level, which is determined by the voltage supply control circuit 122, may be equal to the magnitude of the power supply voltage Vcc or the magnitude of the boosted voltage supply signal Vpp, as described more fully hereinbelow with respect to FIG. 6.

Upon completion of an operation to verify the programmed or erased state of the first row of memory cells, the row address X_Add is changed to preferably designate the second row of memory cells (C21–12n). Based on this change in address, the first word line driver WD1 then receives a logic "1" row select signal at an input node 140. This logic "1" row select signal causes the NMOS pull-down transistor 136 to turn on and causes the NMOS pull-down transistor 134 to turn off when node 142 is driven to a logic "0" level by the inverter 138. When NMOS pull-down transistor 136 turns on, the output node 146 is pulled down from a logic 1 level (equal to Vcc) to a logic "0" level (e.g., Vss, GND=0 volts) and PMOS pull-up transistor 130 turns on. When PMOS pull-up transistor 130 turns on, node 144 of the word line driver is pulled up to a logic 1 level. The magnitude of the logic 1 level, which is determined by the voltage supply control circuit 122, may be equal to the magnitude of the power supply voltage Vcc or the magnitude of the boosted voltage supply signal Vpp.

According to a preferred aspect of the present invention, the magnitude of the logic 1 signal at node 144 for each non-selected word line driver (e.g., WD2–WDm) and the magnitude of the logic 1 signal at node 146 for the selected word line driver (e.g., WD1) are set to the boosted voltage level Vpp while the memory cells (e.g., C11–C1n) in the selected row (e.g., first row) are undergoing a program or erase verification operation. However, just prior to commencement of a program or erase verification operation for another selected row of memory cells (e.g., C21–C2n), the magnitude of the logic 1 signal at node 146 for the selected word line driver and the magnitude of the logic 1 signal at node 144 of the non-selected word line drivers are level-shifted downwards to the power supply voltage level Vcc (i.e., the voltage on these nodes drops from Vpp to Vcc as illustrated during time interval "t3" in FIG. 6). Then, upon commencement of a program or erase verification operation for the next selected row of memory cells (e.g., the second row), the magnitude of the logic 1 signal at node 146 for the previously selected word line driver (e.g., WD1) and the magnitude of the logic 1 signal at node 144 of the other non-selected word line drivers (e.g., WD3–WDm) are pulled down from the power supply level Vcc to a reference voltage level (e.g., Vss).

Accordingly, because the voltage on these nodes 146 and 144 is reduced from Vpp (e.g., 6–7 volts) to Vcc (e.g., 2.7–3.6 volts) just prior to commencement of a new program or erase verification operation, the size of the NMOS pull-down transistors 134 and 136 can be reduced and the word line pitch PL illustrated by FIG. 4 can also be reduced. This means that higher integration densities can be achieved by the present invention because smaller word line drivers WD1–WDm can be used.

Referring still to FIG. 5, the voltage supply control circuit 122 provides either the power supply voltage signal Vcc or the boosted voltage signal Vpp to the word line drivers WD1–WDm. In particular, the illustrated voltage supply control circuit 122 is responsive to the verify enable signal VER_EN and the flag signal XA_CHG, and comprises an inverter 154, a pair of level-shifters 158 and 160, a two-input NOR gate 156, a PMOS pull-up transistor 150 and a PMOS pass transistor 152, as illustrated. Based on the illustrated configuration of the voltage supply control circuit 122, the word line driver circuit 114 is powered at a first voltage level (e.g., Vcc) when the verify enable signal is inactive (e.g., logic 0 level) or the flag signal is active (e.g., logic 1 level), and powers the word line driver circuit 114 at a second voltage level (e.g., Vpp) when the verify enable signal is active (e.g., logic 1 level) and the flag signal is inactive (e.g., logic 0 level).

Figure 6:
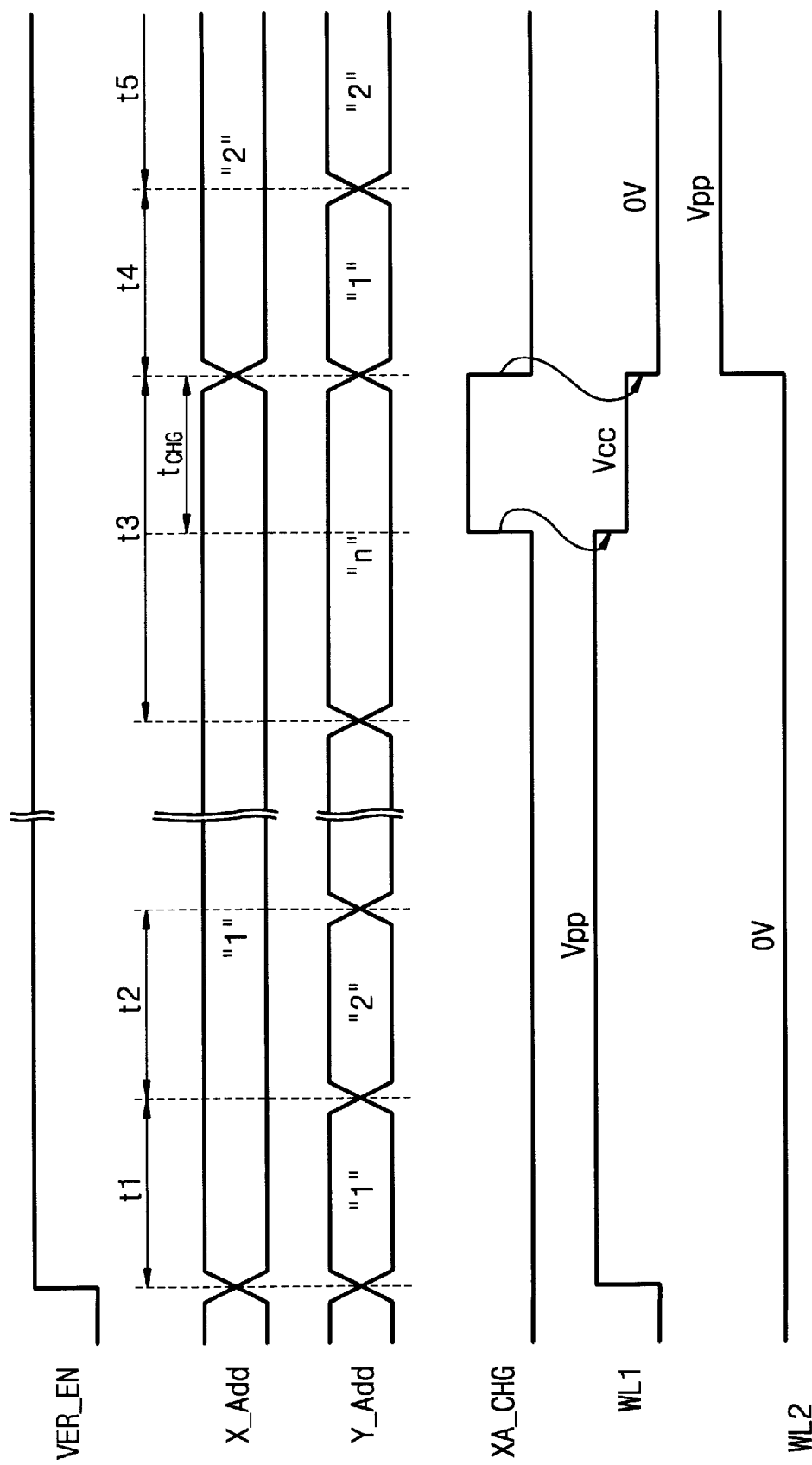
FIG. 6 is a timing diagram that illustrates operation of the memory device of FIG. 4.

Accordingly, as illustrated by the timing diagram of FIG. 6, a program or erase verification mode commences when the verification enable signal VER_EN generated by the program/erase verification control circuit 124 of FIGS. 4 and 5 is driven to a logic 1 level. When this occurs and the first word line WL1 is selected (i.e., X_Add designates the first row of memory cells C11–C1n), the first word line WL1 is driven to a logic 1 level corresponding to the boosted voltage level Vpp (e.g., 6–7 volts). Operations are then performed to verify the programmed or erased state of the EEPROM memory cells in the first row thereof. During these verification operations, the column address Y_Add is sequenced through a series of column addresses and the column selection circuit 118 evaluates signals on each of the bit lines BL1–BLn. As illustrated, the column address corresponding to the first EEPROM cell C11 in the first row is designated during time interval t1 and the column address corresponding to the second EEPROM cell C12 in the first row is designated during time interval t2.

Then, during time interval t3, the state of the last EEPROM cell C1n in the first row is verified. Once this verification operation is complete, the flag signal XA_CHG is generated as a pulse by the program/erase verification control circuit 124. In response, the voltage on the first word line WL1 (and the voltage at nodes 144 of the non-selected word line drivers WD2–WDm) is reduced from the boosted voltage level Vpp to the power supply voltage level Vcc in anticipation of a change in the row address signal X_Add and the subsequent commencement of operations to verify the state of EEPROM memory cells in the second row during time intervals t4 and t5, as illustrated. This change in voltage on the first word line WL1 occurs during the latter portion of the time interval t3 (during time interval tCHG when XA_CHG=1). Finally, after a trailing edge of the flag signal XA_CHG, the second word line WL2 is driven to a boosted voltage level Vpp and operations to verify the state of memory cells in the second row are performed in a conventional manner.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a memory cell array having a first row of memory cells therein that are electrically coupled to a first word line;
   a word line driver having an output electrically coupled to the first word line; and
   a voltage supply control circuit that is responsive to a verify enable signal and a flag signal and powers said word line driver at a first voltage level when the verify enable signal is inactive or the flag signal is active, and powers said word line driver at a second voltage level greater than the first voltage level when the verify enable signal is active and the flag signal is inactive.

2. The memory device of claim 1, wherein the first voltage level corresponds to a power supply voltage level; and wherein the second voltage level corresponds to a boosted voltage level having a magnitude that exceeds a magnitude of the power supply voltage level.

3. The memory device of claim 1, further comprising a program/erase verification control circuit that generates an active verify enable signal continuously during a verification time interval and generates an active flag signal as a series of pulses during the verification time interval.

4. The memory device of claim 3, further comprising a voltage boosting circuit having an output electrically coupled to said voltage supply control circuit.

5. A method of operating an integrated circuit memory device, comprising the steps of:
   verifying a state of a first row of memory cells while simultaneously driving a first word line electrically coupled to the first row at a boosted voltage level, during a first verification time interval; then generating an active flag signal during the first verification time interval;

driving, in response to the active flag signal, the first word line at a voltage level that is intermediate the boosted voltage level and a reference voltage level; and then verifying a state of a second row of memory cells while simultaneously driving the first word line at the reference voltage level and a second word line electrically coupled to the second row at the boosted voltage level, during a second verification time interval.

6. The method of claim 5, wherein said driving step comprises driving the first word line at a power supply voltage level, in response to the active flag signal.

7. The method of claim 5, further comprising the step of generating a column address corresponding to an address of a last memory cell in the first row while said driving step is being performed.

8. The method of claim 6, further comprising the step of generating a column address corresponding to an address of a last memory cell in the first row while said driving step is being performed.

9. A non-volatile semiconductor memory device comprising:

a non-volatile memory cell array having a plurality of non-volatile memory cells arranged in rows and columns;

a voltage boosting circuit for providing a boosted voltage higher than a power supply voltage;

a control circuit for generating a first signal indicative of a program/erase verify period and a second signal indicating that a row address change is imminent;

a voltage switching circuit for selectively outputting either the boosted voltage or the power supply voltage in response to the first and second signals;

a plurality of word-lines each coupled with corresponding ones of said non-volatile memory cells;

a plurality of word-line drivers coupled between said voltage switching circuit and said word-lines, for driving said word-lines in turn by means of either of the boosted voltage and the power supply voltage; and a row decoder for selecting one of said word-line drivers in response to a row address, wherein said second signal is activated during a time interval from a point in time when verification of the last cell on a selected row is completed to a point in time when the row address is changed, and said voltage switching circuit provides the power supply voltage to the word-line drivers when the second signal is activated.

10. The memory device of claim 9, wherein said word-line drivers each includes a level shifter.

11. The memory device of claim 10, wherein said level shifter comprises:

a first PMOS transistor having a source coupled to said voltage switching circuit, a drain, and a gate coupled to a corresponding word-line;

a second PMOS transistor having a source coupled to said voltage switching circuit, a drain coupled to said corresponding word-line, and a gate coupled to the drain of said first PMOS transistor;

an inverter having a input coupled to said row decoder and an output;

a first NMOS transistor having a drain coupled to the drain of said first PMOS transistor, a source coupled to a ground voltage, and a gate coupled to the output of said inverter; and a second NMOS transistor having a drain coupled to said corresponding word-line, a source coupled to the ground voltage, and a gate coupled to said row decoder.

12. The memory device of claim 9, wherein said voltage switching circuit comprises:

a first switch element coupled between said power supply voltage and said word-line drivers;

a second switch element coupled between said voltage boosting circuit and said word-line drivers; and a logic circuit for selectively controlling said first and second switch elements in response to the first and second signals.

13. The memory device of claim 9, wherein said voltage switching circuit provides the boosted voltage to said word-line drivers when the first signal is activated.

14. In a non-volatile semiconductor memory device including a non-volatile memory cell array having a plurality of electrically programmable and erasable non-volatile memory cells arranged in rows of word-lines and columns of bit-lines, a method for driving said word-lines during program and erase modes of said memory device in which said word-lines and bit-lines are driven sequentially, the method comprising the steps of:

supplying a boosted voltage greater than a power supply voltage to a first word-line during a first verification time interval;

supplying the boosted voltage to a second word-line during a second verification time interval which commences upon termination of the first verification time interval; and discharging the first word-line from the boosted voltage to a reduced voltage that is intermediate the boosted voltage and a ground reference voltage at a trailing end of the first verification time interval and prior to commencement of the second verification time interval.

15. The method of claim 14, wherein the reduced voltage equals the power supply voltage.

16. The method of claim 14, further comprising the step of generating an active flag signal; and wherein said discharging step is performed in response to generation of the active flag signal.

* * * * *